(12) United States Patent
Liu et al.

(10) Patent No.: US 10,069,009 B2
(45) Date of Patent: Sep. 4, 2018

(54) METHOD FOR FORMING RECESS WITHIN EPITAXIAL LAYER

(71) Applicant: UNITED MICROELECTRONICS CORP., Hsin-Chu (TW)

(72) Inventors: An-Chi Liu, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/861,700

(22) Filed: Jan. 4, 2018

(65) Prior Publication Data

US 2018/0166571 A1   Jun. 14, 2018

Related U.S. Application Data

(62) Division of application No. 15/401,092, filed on Jan. 8, 2017, now Pat. No. 9,899,522.

(30) Foreign Application Priority Data

Dec. 13, 2016 (TW) .............................. 105141215 A

(51) Int. Cl.
| | | |
|---|---|---|
| *H01L 21/00* | (2006.01) | |
| *H01L 29/78* | (2006.01) | |
| *H01L 23/532* | (2006.01) | |
| *H01L 23/535* | (2006.01) | |
| *H01L 29/267* | (2006.01) | |
| *H01L 29/24* | (2006.01) | |
| *H01L 29/16* | (2006.01) | |
| *H01L 29/161* | (2006.01) | |
| *H01L 29/08* | (2006.01) | |
| *H01L 21/768* | (2006.01) | |
| *H01L 21/283* | (2006.01) | |

(Continued)

(52) U.S. Cl.
CPC ........ *H01L 29/7848* (2013.01); *H01L 21/283* (2013.01); *H01L 21/7684* (2013.01); *H01L 21/76805* (2013.01); *H01L 21/76846* (2013.01); *H01L 21/76895* (2013.01); *H01L 23/535* (2013.01); *H01L 23/53266* (2013.01); *H01L 29/0847* (2013.01); *H01L 29/161* (2013.01); *H01L 29/1608* (2013.01); *H01L 29/24* (2013.01); *H01L 29/267* (2013.01); *H01L 29/41766* (2013.01); *H01L 29/665* (2013.01); *H01L 29/6659* (2013.01); *H01L 29/66636* (2013.01); *H01L 29/7834* (2013.01); *H01L 29/7845* (2013.01); *H01L 29/165* (2013.01); *H01L 29/66545* (2013.01)

(58) Field of Classification Search
None
See application file for complete search history.

(56) References Cited

U.S. PATENT DOCUMENTS

| | | |
|---|---|---|
| 7,719,062 B2 | 5/2010 | Fischer |
| 9,324,610 B2 | 4/2016 | Hung et al. |

(Continued)

*Primary Examiner* — Reema Patel
(74) *Attorney, Agent, or Firm* — Winston Hsu

(57) ABSTRACT

A method for fabricating semiconductor device includes the steps of: forming a gate structure on a substrate; forming a first recess adjacent to two sides of the gate structure; forming an epitaxial layer in the first recess; removing part of the epitaxial layer to form a second recess; and forming an interlayer dielectric (ILD) layer on the gate structure and into the second recess.

10 Claims, 5 Drawing Sheets

(51) Int. Cl.
    *H01L 29/417*     (2006.01)
    *H01L 29/165*     (2006.01)
    *H01L 29/66*     (2006.01)

(56) References Cited

U.S. PATENT DOCUMENTS 9,466,678 B2    10/2016    Huang et al.
2016/0181383 A1*    6/2016    Huang .............. H01L 29/41758
                                                       257/757

* cited by examiner

METHOD FOR FORMING RECESS WITHIN EPITAXIAL LAYER

CROSS REFERENCE TO RELATED APPLICATIONS

This application is a division of U.S. application Ser. No. 15/401,092 filed Jan. 8, 2017, and incorporated herein by reference in its entirety.

BACKGROUND OF THE INVENTION

1. Field of the Invention

The invention relates to a method for fabricating semiconductor device, and more particularly, to a method of forming recess within an epitaxial layer.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, current approach of using epitaxial growth process to form epitaxial layer is still insufficient in reaching a balance for overall resistance of the device as well as preventing short channel effect. Hence, how to improve the current fabrication to resolve this issue has become an important task in this field.

SUMMARY OF THE INVENTION

According to an embodiment of the present invention, a method for fabricating semiconductor device includes the steps of: forming a gate structure on a substrate; forming a first recess adjacent to two sides of the gate structure; forming an epitaxial layer in the first recess; removing part of the epitaxial layer to form a second recess; and forming an interlayer dielectric (ILD) layer on the gate structure and into the second recess.

According to another aspect of the present invention, a semiconductor device includes: a substrate; a gate structure on the substrate; a first recess adjacent to two sides of the gate structure; an epitaxial layer in the first recess; and a contact etch stop layer (CESL) on the epitaxial layer and in the first recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
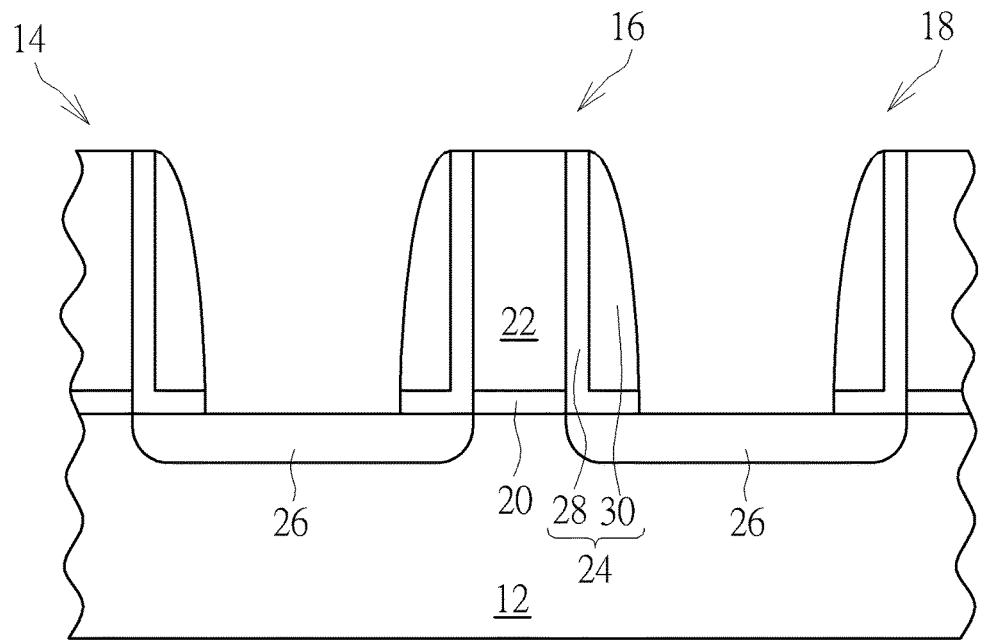
FIGS. 1-8 illustrate a method for fabricating semiconductor device according to a preferred embodiment of the present invention.

Referring to FIGS. 1-8, FIGS. 1-8 illustrate a method for fabricating semiconductor device according to a preferred embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12, and a shallow trench isolation (STI) preferably made of silicon oxide is formed in the substrate 12 to divide the transistor regions.

It should be noted that even this embodiment pertains to the fabrication of a planar field-effect transistor, it would also be desirable to apply the following fabrication process to a non-planar device such as a fin field-effect transistor (FinFET). In such instance, at least a fin-shaped structure is formed on the substrate 12 and the bottom of the fin-shaped structure is preferably surrounded by the aforementioned STI, which is also within the scope of the present invention.

According to an embodiment of the present invention, the fin-shaped structure could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, a plurality of gate structures 14, 16, 18 or dummy gates are formed on the substrate 12. In this embodiment, the formation of the gate structures 14, 16, 18 could be accomplished by a gate first process, a high-k first approach from gate last process, or a high-k last approach from gate last process. Since this embodiment pertains to a high-k last approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 14, 16, 18 composed of patterned gate dielectric layer 20 and patterned material layer 22 are formed on the substrate 12.

Next, at least a spacer 24 is formed on the sidewalls of each of the gate structures 14, 16, 18, and a lightly doped drain 26 is formed in the substrate 12 adjacent to two sides of the spacer 24. In this embodiment, the spacer 24 could be a single spacer or a composite spacer, such as a spacer including but not limited to for example an offset spacer 28 and a main spacer 30. Preferably, the offset spacer 28 and the main spacer 30 could include same material or different material while both the offset spacer 28 and the main spacer 30 could be made of material including but not limited to for example $SiO_2$, SiN, SiON, SiCN, or combination thereof. The lightly doped drain 26 could include n-type dopants or p-type dopants depending on the type of device being fabricated.

Figure 2:
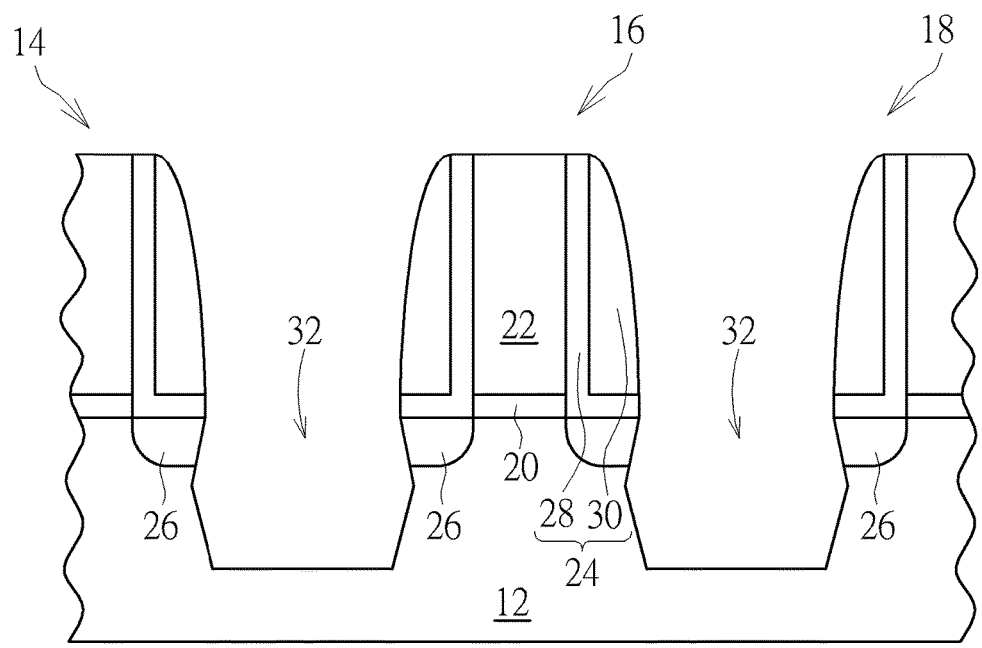

Next, as shown in FIG. 2, an etching process is conducted to form a first recess 32 in the substrate 12 adjacent to two sides of the spacer 24. Preferably, the etching process could be accomplished by first conducting a dry etching process to form an initial recess (not shown) in the substrate 12 adjacent to two sides of the gate structure 16, and then conducting a wet etching process to expand the recess isotropically for forming a first recess 32. According to an embodiment of the present invention, the wet etching process could be accomplished using etchant including but not limited to for example ammonium hydroxide ($NH_4OH$) or tetramethylammonium hydroxide (TMAH). It should be noted that the formation of the first recess 32 is not limited to the combination of dry etching process and wet etching process addressed previously. Instead, the first recess 32 could also be formed by single or multiple dry etching and/or wet etching processes, which are all within the scope of the present invention. According to an embodiment of the present invention, the first recess 32 could have various cross-section shapes, including but not limited to for example a circle, a hexagon, or an octagon. Despite the cross-section of the first recess 32 in this embodiment pertains to be a hexagon, it would also be desirable to form the first recess 32 with aforementioned shapes, which are all within the scope of the present invention.

Figure 3:
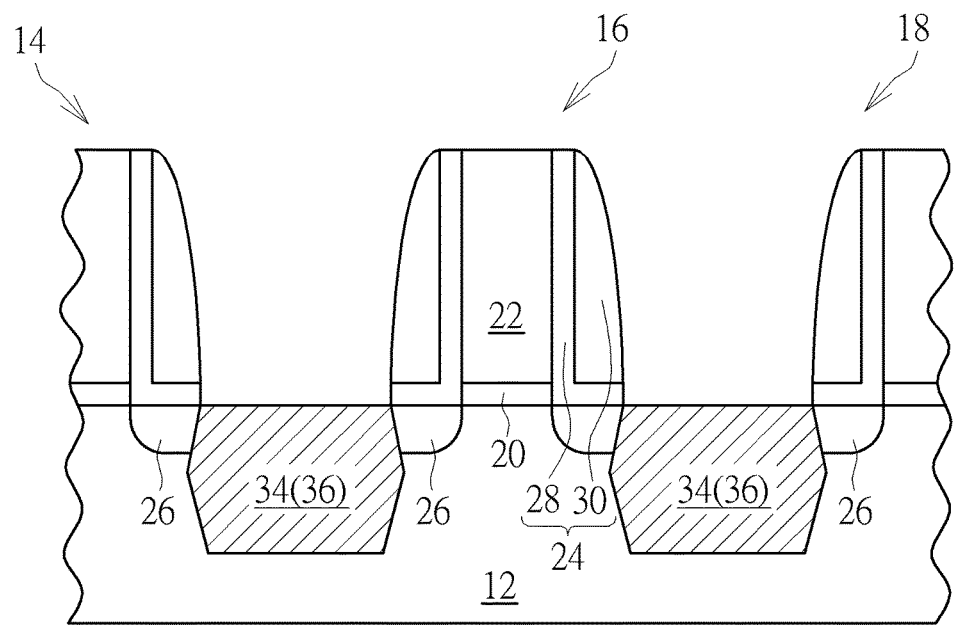

Next, as shown in FIG. 3, a selective epitaxial growth (SEG) process is conducted to form an epitaxial layer 34 in the first recess 32. In this embodiment, a top surface of the epitaxial layer 34 is preferably even with a top surface of the substrate 12, in which the epitaxial layer 34 also shares substantially same cross-section shape with the first recess 32. For instance, the cross-section of the epitaxial layer 32 could also a circle, a hexagon, or an octagon depending on the demand of the product. In this embodiment, the epitaxial layer 32 could also be formed to include different material depending on the type of transistor being fabricated. For instance, if the MOS transistor being fabricated were to be a PMOS transistor, the epitaxial layer 34 could be made of material including but not limited to for example SiGe, SiGeB, or SiGeSn. If the MOS transistor being fabricated were to be a NMOS transistor, the epitaxial layer 34 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layer 34 is preferred to have less or no germanium atom at all to facilitate the formation of silicide afterwards. It should be noted that even though the top surfaces of the substrate 12 and epitaxial layer 34 are coplanar in this embodiment, it would also be desirable extend the epitaxial layer 34 upward so that the top surface of the epitaxial layer 34 is higher than the top surface of the substrate 12 according to another embodiment of the present invention.

Next, an ion implantation process is conducted to form a source/drain region 36 in part or the entire epitaxial layer 34. According to an embodiment of the present invention, the source/drain region 36 could also be formed insituly during the SEG process. For instance, the source/drain region 36 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain region. Moreover, the dopants within the source/drain region 36 could also be formed with a gradient, which is also within the scope of the present invention.

Figure 4:
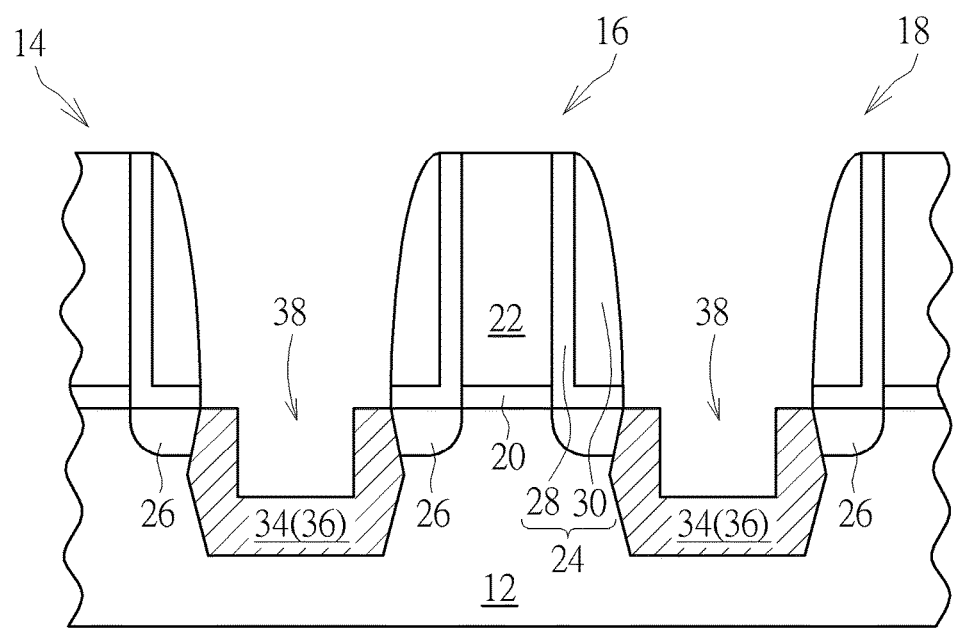

Next, as shown in FIG. 4, a patterned mask (not shown), such as a patterned resist is formed to cover the gate structures 14, 16, 18 and part of the epitaxial layer 34, and an etching process is conducted by using the patterned mask as mask to remove part of the epitaxial layer 34 for forming a second recess 38 in the epitaxial layer 34. The patterned mask is then stripped thereafter. In this embodiment, the etching process conducted to remove part of the epitaxial layer 34 at this stage is preferably a dry etching process and the second recess 38 formed in the epitaxial layer 34 is substantially rectangular.

Figure 5:
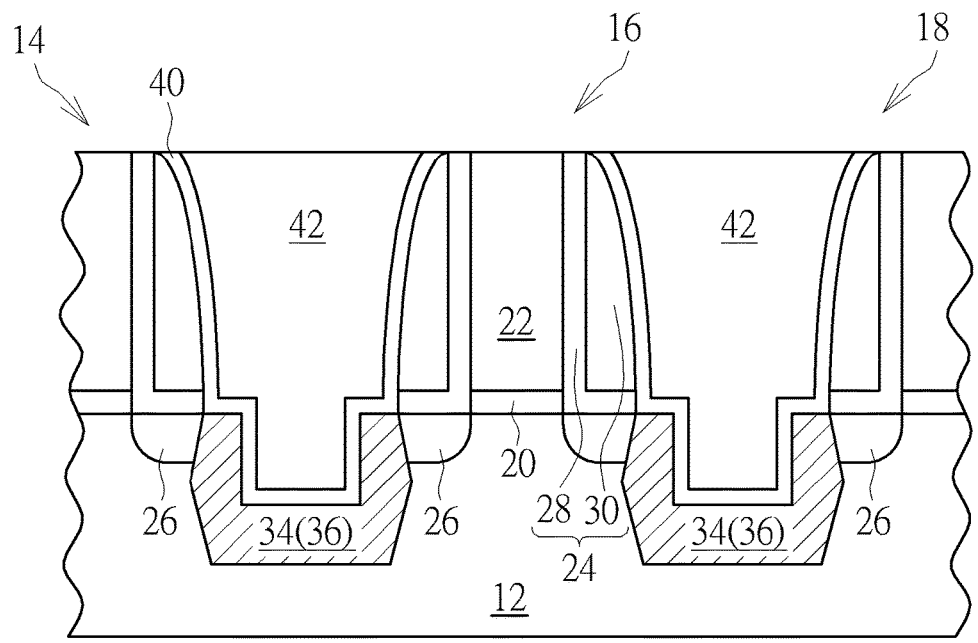

Next, as shown in FIG. 5, a contact etch stop layer (CESL) 40 is formed in the second recess 38 to cover the substrate 12 surface and the gate structures 14, 16, 18, and an interlayer dielectric (ILD) layer 42 is formed on the CESL 40 afterwards. Next, a planarizing process, such as a chemical mechanical polishing (CMP) process is conducted to remove part of the ILD layer 42 and part of the CESL 40 to expose the gate material layer 22 composed of polysilicon so that the top surfaces of the gate material layer 22 and ILD layer 42 are coplanar.

Figure 6:
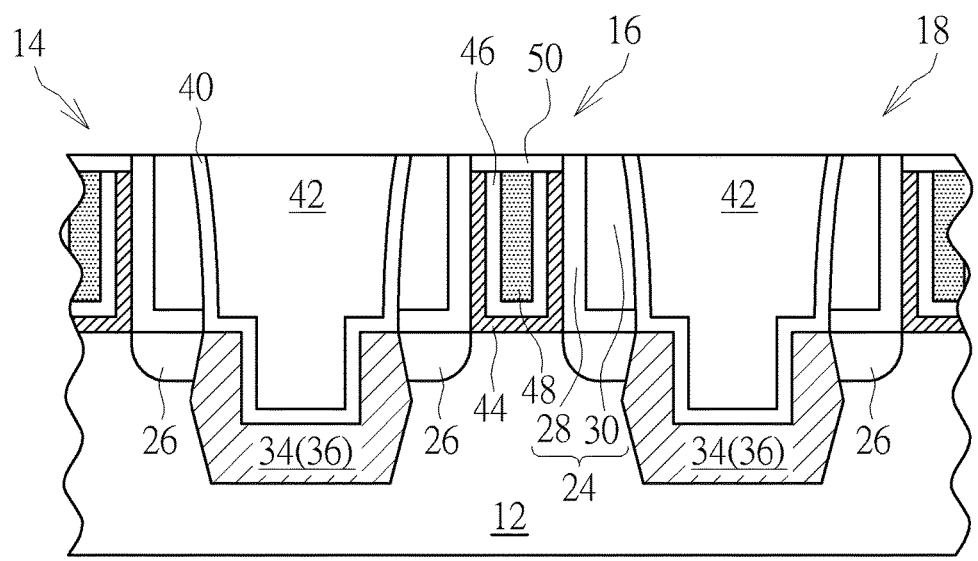

Next, as shown in FIG. 6, a replacement metal gate (RMG) process is conducted to transform the gate structures 14, 16, 18 into metal gates. For instance, the RMG process could be accomplished by first performing a selective dry etching or wet etching process, such as using etchants including but not limited to for example ammonium hydroxide ($NH_4OH$) or tetramethylammonium hydroxide (TMAH) to remove the gate material layer 22 or even gate dielectric layer 20 from gate structures 14, 16, 18 for forming recesses (not shown) in the ILD layer 42. Next, a selective interfacial layer or gate dielectric layer (not shown), a high-k dielectric layer 44, a work function metal layer 46, and a low resistance metal layer 48 are formed in the recesses, and a planarizing process such as CMP is conducted to remove part of low resistance metal layer 48, part of work function metal layer 46, and part of high-k dielectric layer 44 to form metal gates. In this embodiment, the gate structures 14, 16, 18 or metal gates fabricated through high-k last process of a gate last process preferably includes an interfacial layer or gate dielectric layer (not shown), a U-shaped high-k dielectric layer 44, a U-shaped work function metal layer 46, and a low resistance metal layer 48.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 46 is formed for tuning the work function of the metal gate in accordance with the conductivity of the device. For an NMOS transistor, the work function metal layer 46 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 46 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 46 and the low resistance metal layer 48, in which the material of the barrier layer may include titanium (Ti), titanium nitride (TiN), tantalum (Ta) or tantalum nitride (TaN). Furthermore, the material of the low-resistance metal layer 48 may include copper (Cu), aluminum (Al), titanium aluminum (TiAl), cobalt tungsten phosphide (CoWP) or any combination thereof.

Next, part of the high-k dielectric layer 44, part of the work function metal layer 46, and part of the low resistance metal layer 48 are removed to form recesses (not shown), an hard masks 50 are then formed into the recesses so that the top surfaces of the hard masks 50 and ILD layer 42 are coplanar. The hard masks 50 could be made of material including but not limited to for example $SiO_2$, SiN, SiON, SiCN, or combination thereof.

Figure 7:
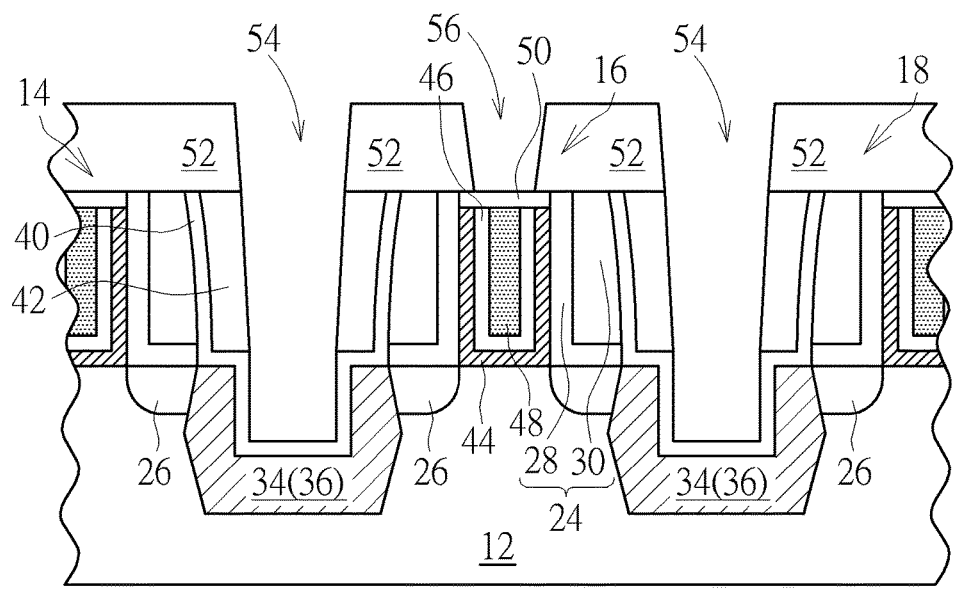

Next, as shown in FIG. 7, a dielectric layer 52 is formed on the ILD layer 42 to cover the gate structures 14, 16, 18, and an etching process is conducted by using a patterned mask (not shown) such as a patterned resist as mask to remove part of the dielectric layer 52 and part of the ILD layer 42 adjacent to two sides of the gate structure 16 to form contact holes 54 exposing the CESL 40 on the epitaxial layer 34, and at the same time remove part of the dielectric layer 52 directly on top of the gate structure 16 to form contact hole 56 exposing the hard mask 50. In this embodiment, the dielectric layer 52 could include oxide material such as but not limited to for example tetraethyl orthosilicate (TEOS).

Figure 8:
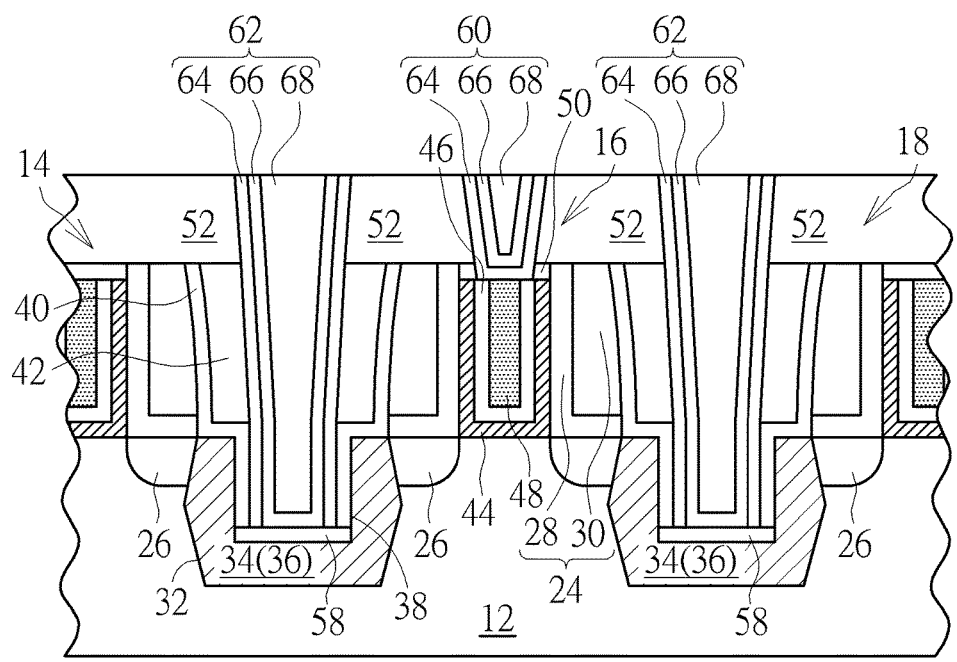

Next, as shown in FIG. 8, an etching process is conducted to remove part of the CESL 40 directly on the epitaxial layer 34 and part of the hard mask 50 directly on the gate structure 16 at the same time, and then a contact plug formation along with silicide process is conducted to form a silicide 58 in the contact holes 54 and contact plug 60 electrically connected to the gate structure 16 and contact plugs 62 electrically connected to the epitaxial layer 34 or source/drain region 36 adjacent to two sides of the gate structure 16.

In this embodiment, the contact plug formation could be accomplished by sequentially depositing a first stress layer 64 and a barrier layer 66 in the contact holes 54, 56, in which the first stress layer 64 and the barrier layer 66 are formed conformally on the surface of the epitaxial layer 34 and inner sidewalls of the contact holes 54, 56. In this embodiment, the first stress layer 64 preferably includes metal containing stress, such as material including but not limited to for example Ti, Co, Ni, Pt, or combination thereof. The barrier layer 66 on the other hand could include material such as but not limited to for example TiN or TaN.

After depositing the first stress layer 64 and barrier layer 66, a first thermal treatment process and a second thermal treatment process are conducted sequentially to form a silicide 58 on the epitaxial layer 34. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a second stress layer 68 is deposited to fill the contact holes 54, 56 completely. In this embodiment, the second stress layer 68 also includes metal material containing stress, such as material including but not limited to for example tungsten. Next, a planarizing process, such as a CMP process is conducted to remove part of the second stress layer 68, part of the barrier layer 66, and part of the first stress layer 64, and depending on the demand of the process also removing part of the dielectric layer 52 for forming a contact plugs 60, 62 electrically connected to the gate structure 16 and source/drain region 36. This completes the fabrication of a semiconductor device according to a preferred embodiment of the present invention.

It should be noted that even though each of the first stress layer 64 and the second stress layer 68 disclosed in this embodiment pertains to be a single-layered structure, each of the first stress layer 64 and the second stress layer 68 could also be a multi-layered structure containing two layers or above. For instance, the first stress layer 64 could be made of a combination of a metal layer and a first stress layer, in which the metal layer and the first stress layer could be made of material including but not limited to for example Ti, Co, Ni, and Pt while the metal layer does not contain any stress but the first stress layer includes stress. Similarly, the second stress layer 68 could be made of a combination of a metal layer and a second stress layer, in which both the metal layer and the second stress layer could be made of material including but not limited to for example tungsten while the metal layer does not contain any stress but the second stress layer includes stress. These variations are all within the scope of the present invention.

Referring again to FIG. 8, which further illustrates a structural view of a semiconductor device according to an embodiment of the present invention. As shown in FIG. 8, the semiconductor device includes at least a gate structure 16 on the substrate 12, a first recess 32 adjacent to two sides of the gate structure 16, an epitaxial layer 34 in the first recess 32, a second recess 38 in the epitaxial layer 34, a CESL 40 in the second recess 38, a ILD layer 42 on the CESL 40, and contact plugs 62 in the ILD layer 42 adjacent to two sides of the gate structure 16 and extending downward into the second recess 38 and first recess 32.

Specifically, the CESL 40 preferably contacts the epitaxial layer 34 within the first recess 32 directly and the contact plugs 62 contact the CESL 40 and epitaxial layer 34 within the first recess 32 directly. Viewing from another perspective, the contact plugs 62 preferably contact the CESL 40 above a top surface of the substrate 12 and below the top surface of the substrate 12 directly at the same time.

Figure 9:
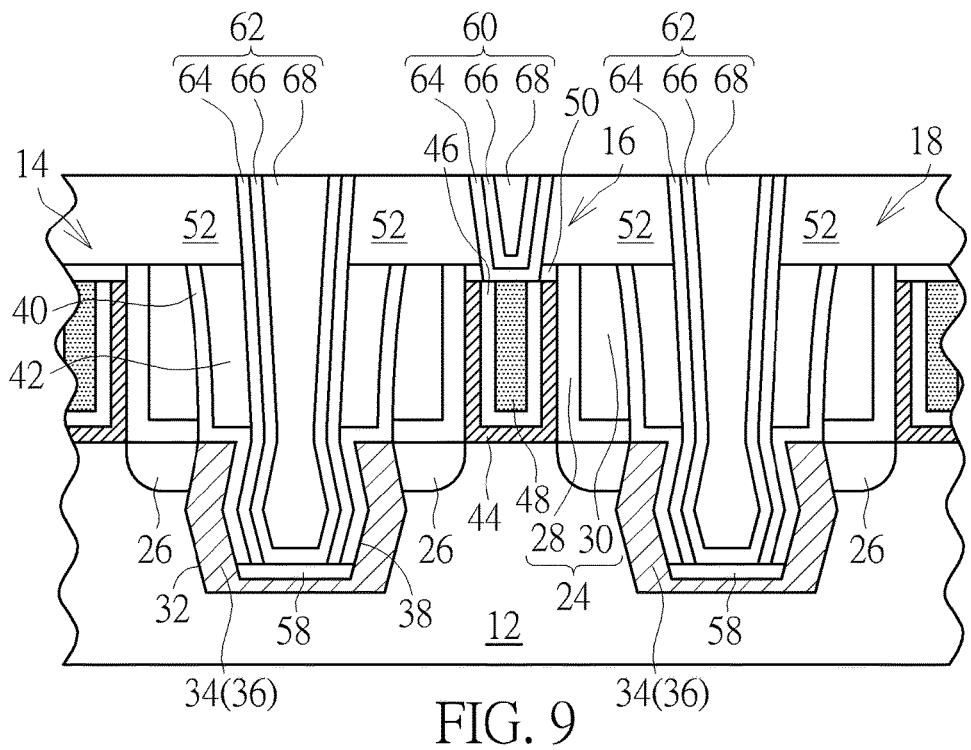
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, it would be desirable to conduct an additional lateral etching after the second recess 38 is formed in the epitaxial layer 34 in FIG. 4. Preferably, the lateral etching could be accomplished by a wet etching process to isotropically expand the second recess 38 so that the rectangular cross-section view of the recess would then become hexagonal as shown in FIG. 9, or even circular or octagonal, which are all within the scope of the present invention. According to an embodiment of the present invention, the wet etching process could be accomplished by using etchant including but not limited to for example ammonium hydroxide ($NH_4OH$) or tetramethylammonium hydroxide (TMAH). Next, processes conducted in FIGS. 5-8 could be carried out afterwards to form silicides 58, contact plug 60, and contact plugs 62.

Figure 10:
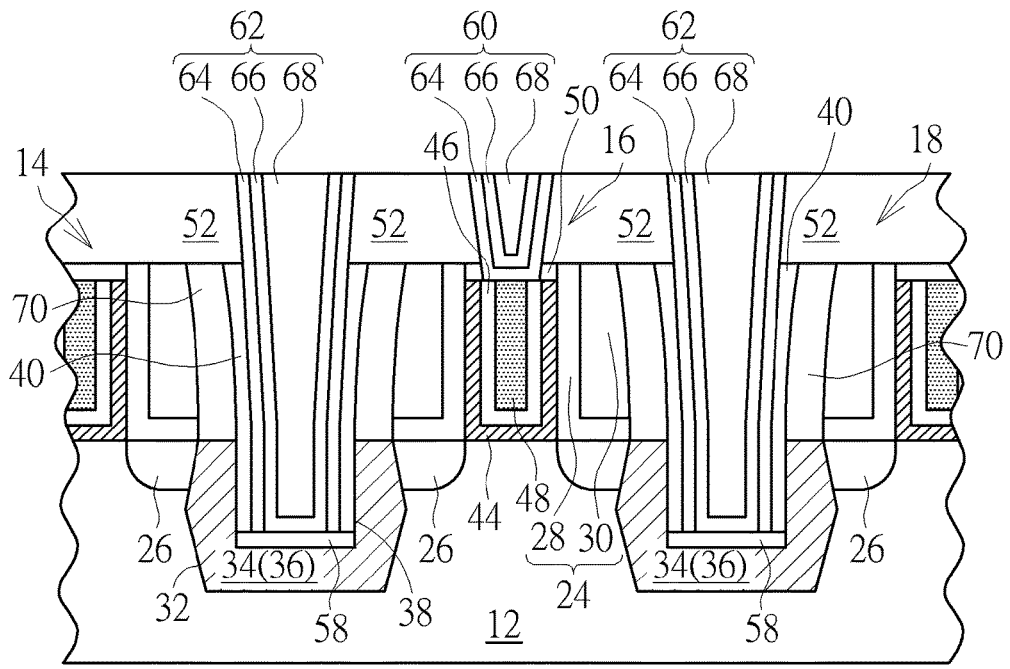
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, it would be desirable to form an additional spacer 70 on the sidewalls of the spacer 24 after the epitaxial layer 34 is formed in FIG. 3, and then conduct an etching process by using the spacer 70 as mask to form the second recess 38 shown in FIG. 4. Similar to the material of the spacer 24, the spacer 70 could also be made of material including but not limited to for example $SiO_2$, SiN, SiON, SiCN, or combination thereof. Next, process conducted from FIGS. 5-8 could be carried out to form elements such as CESL 40, ILD layer 42, silicides 58, contact plug 60, and contact plugs 62. In contrast to the aforementioned embodiment, the edge of the second recess 38 in this embodiment is aligned with an edge of the spacer 70 and the ILD layer 42 could be removed completely during contact plug formation so that the CESL 40 above the substrate 12 surface could contact the contact plugs 62 directly, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a gate structure on a substrate;
   forming a first recess adjacent to two sides of the gate structure;
   forming an epitaxial layer in the first recess;
   removing part of the epitaxial layer to form a second recess; and
   after removing part of the epitaxial layer to form the second recess forming an interlayer dielectric (ILD) layer on the gate structure and into the second recess.

2. The method of claim 1, further comprising:
   forming a spacer adjacent to the gate structure;
   forming the first recess adjacent to the spacer;
   forming the epitaxial layer;
   forming the second recess in the epitaxial layer;
   forming a contact etch stop layer (CESL) on the gate structure and in the second recess;
   forming the ILD layer on the CESL;
   planarizing part of the ILD layer; and
   transforming the gate structure into a metal gate.

3. The method of claim 2, further comprising:
   forming a hard mask on the metal gate;
   removing part of the ILD layer to form a first contact hole on the epitaxial layer;
   removing part of the ILD layer to form a second contact hole on the hard mask; and
   removing part of the CESL and part of the hard mask at the same time.

4. The method of claim 3, further comprising:
   forming a first stress layer in the first contact hole and the second contact hole;
   forming a second stress layer in the first contact hole and the second contact hole;
   planarizing part of the first stress layer and part of the second stress layer to form a first contact plug and a second contact plug.

5. The method of claim 4, wherein the first stress layer comprises Ti.

6. The method of claim 4, wherein the second stress layer comprises W.

7. The method of claim 1, further comprising:
   performing a first etching process to form the first recess;
   forming the epitaxial layer in the first recess; and
   performing a second etching process to form the second recess.

8. The method of claim 7, wherein the second etching process comprises a lateral etching process.

9. The method of claim 1, wherein the first recess comprises a hexagon.

10. The method of claim 1, wherein the second recess comprises a hexagon or a rectangle.

* * * * *